(12) United States Patent
Jung

(10) Patent No.: US 6,433,597 B2
(45) Date of Patent: Aug. 13, 2002

(54) DELAY LOCKED LOOP WITH REDUCED NOISE RESPONSE

(75) Inventor: Hea-Suk Jung, Ichon (KR)

(73) Assignee: Hyundai Electronics Industries, Co., Ltd., Kyoungki-do (KR)

(*) Notice: Subject to any disclaimer, the term of this patent is extended or adjusted under 35 U.S.C. 154(b) by 0 days.

(21) Appl. No.: 09/896,519

(22) Filed: Jun. 29, 2001

(30) Foreign Application Priority Data

Jun. 30, 2000 (KR) ........................................ 2000-36773

(51) Int. Cl.[7] ................................................ H03D 3/24

(52) U.S. Cl. ...................................... 327/158; 327/156

(58) Field of Search ................................ 327/156, 158, 327/141, 236, 152

(56) References Cited

U.S. PATENT DOCUMENTS 4,789,966 A * 12/1988 Butcher ...................... 327/158
6,075,832 A *  6/2000 Geannopoulos et al. .... 327/152

* cited by examiner

*Primary Examiner*—Dinh T. Le
(74) *Attorney, Agent, or Firm*—Marshall, Gerstein & Borun.

(57) ABSTRACT

A delay locked loop is disclosed which is less responsive to noise so as to improve an AC parameter tAC. The delay locked loop generally includes: a phase detector, a shift register, and a noise determining circuit which is enabled when the delay locked loop is locked for controlling driving of the shift register by determining whether a phase comparison signal from the phase detector is produced by noise. The noise determining circuit drives the shift register when the phase comparison signal has information for driving the shift register at least three times sequentially.

20 Claims, 12 Drawing Sheets

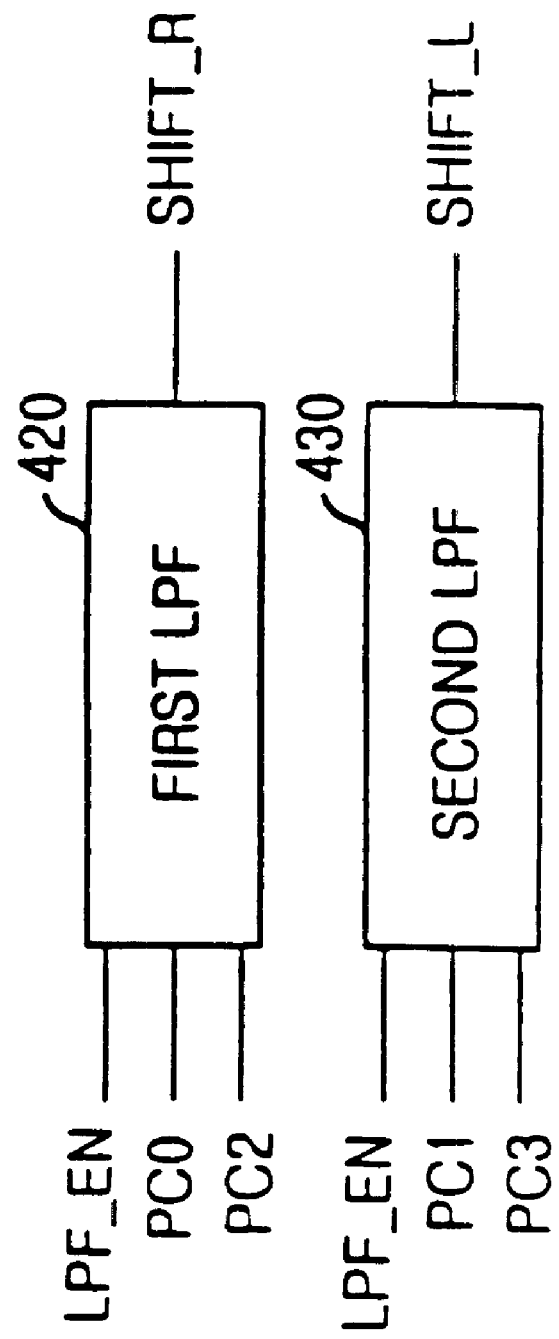

FIG. 6B

| | pc0 | pc1 | lpf_en | hit | nodeA | 621 | 622 | 623 | 624 | 625 | 626 | nodeB | shift_R |
|---|---|---|---|---|---|---|---|---|---|---|---|---|---|
| initial state | H | H | L | L | L | H | X | H | X | L | X | H | L |
| | H | H | L | H | L | H | H | H | H | L | L | H | L |
| 1st sequence | H | H | H | L | H | L | H | H | H | H | L | H | L |
| | H | H | H | H | H | H | L | H | H | L | H | H | L |
| 2nd sequence | H or L | L or H | H | L | L | H | H | H | H | L | H | H | L |
| | H or L | L or H | H | H | L | H | L | H | H | L | L | H | L |

"H" represents a logic high
"L" represents a logic low
"X" don't care(previous level)

FIG. 6C

| | pc0 | pc1 | lpf_en | hit | nodeA | 621 | 622 | 623 | 624 | 625 | 626 | nodeB | shift_R |
|---|---|---|---|---|---|---|---|---|---|---|---|---|---|
| initial state | H | H | L | L | L | H | X | H | X | L | X | H | L |
| | H | H | L | H | L | H | H | H | H | L | L | H | L |
| 1st sequence | H | H | H | L | H | L | L | L | H | H | L | H | L |
| 2nd sequence | H | H | H | H | H | H | L | L | H | H | H | H | L |
| 3rd sequence | H | H | H | L | H | H | H | H | L | L | H | L | L |
| | H | H | H | H | H | H | H | H | H | L | L | L | H |

"H" represents a logic high
"L" represents a logic low
"X" don't care (previous level)

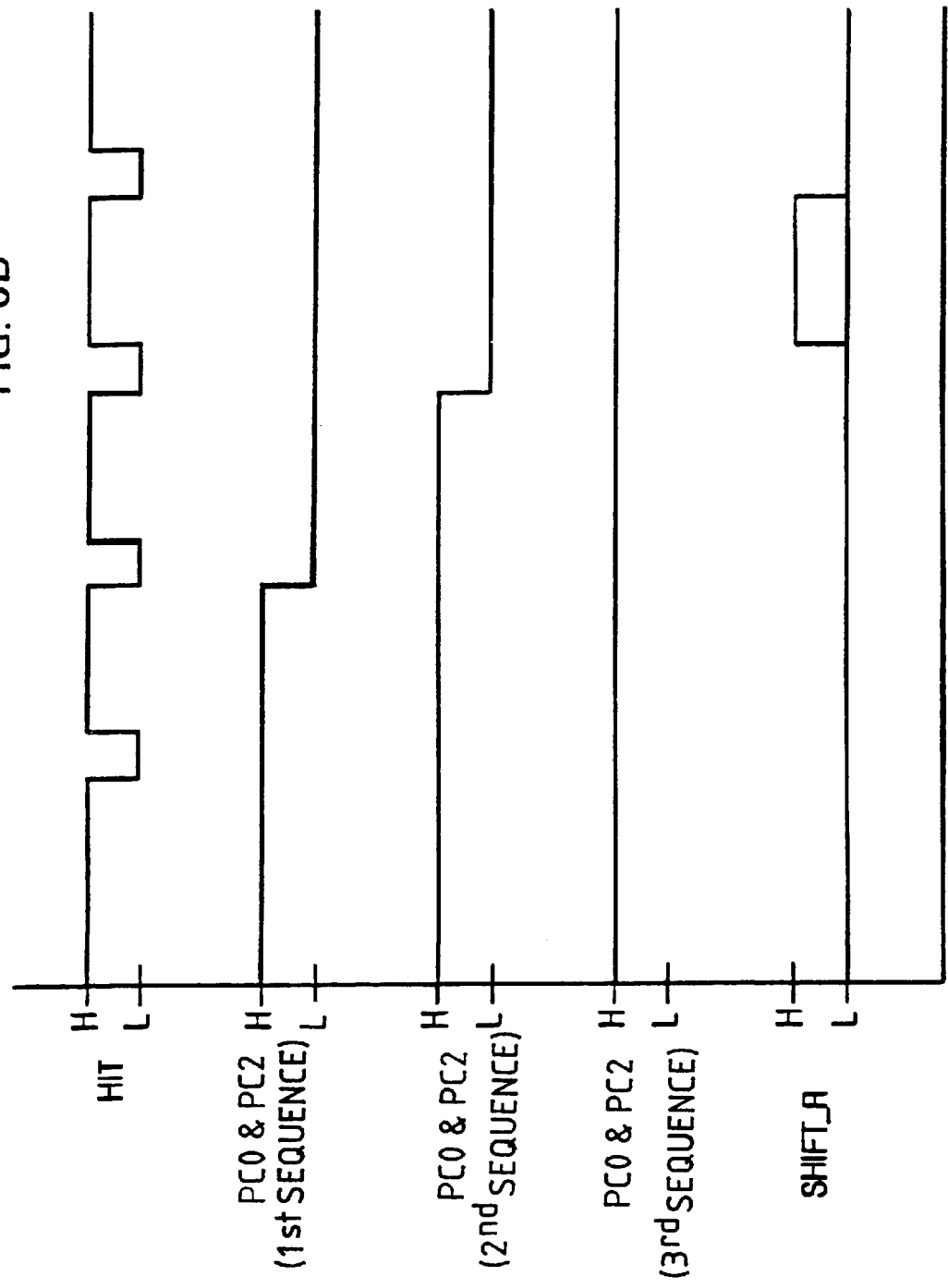

(TIMING DIAGRAM OF PRIOR ART)

(TIMING DIAGRAM OF PRESENT INVENTION)

DELAY LOCKED LOOP WITH REDUCED NOISE RESPONSE

FIELD OF THE INVENTION

The present invention relates to semiconductor memory devices, and, more particularly, to a delay locked loop with reduced noise response.

BACKGROUND OF THE INVENTION

Generally, a delay locked loop is a circuit which can be used to match an internal clock of a synchronous memory with an external clock without error. In other words, by controlling a time delay of the internal clock relative to the external clock, the internal clock is synchronized with the external clock.

FIG. 1 is a block diagram of a conventional delay locked loop. Referring to FIG. 1, the illustrated conventional delay locked loop comprises a first clock buffer 100 for receiving an external clock bar CLKb for producing a falling clock signal FCLKT2 which is activated at a falling edge of a clock. It also includes a second clock buffer 110 for receiving an external clock CLK for producing a rising clock signal RCLKT2 activated at a rising edge of the clock. The delay locked loop of FIG. 1 also includes a clock divider 120 for producing a pulse at every eight clocks of the rising clock signal RCLKT2 and a phase comparator 130 for comparing a reference signal REF from the clock divider 120 with a feedback signal FEEDBACK from a delay modeling circuit 190. In addition, it includes a shift controller 140 for receiving the output of the phase comparator 130 to produce a right shift signal SR and a left shift signal SL for shifting a shift register 150. The shift register 150 controls the delay amount by shifting an output signal with the right shift signal SR and the left shift signal SL. The delay locked loop also includes a first delay line 160 responsive to the output signal of the shift register 150 for adjusting the delay amount of the output signal of the clock divider 120, a second delay line 170 responsive to the output signal of the shift register 150 for adjusting the delay amount of the rising clock signal RCLKT2, and a third delay line 180 responsive to the output signal of the shift register 150 for adjusting the delay amount of the falling clock signal FCLKT2. The delay modeling circuit 190 compensates the time difference between the external clock and the internal clock by using a feedback delay signal FEEDBACK_DLY1 received from the first delay line 160. The device of FIG. 1 also includes a delay locked loop signal driver 200 for driving internal circuitry with the second and third delay lines 170 and 180.

In operation, the clock divider 120 receives the rising clock signal RCLKT2 and produces the reference signal REF and a delay line input signal DELAY_IN that is synchronized with the rising clock signal at every other eight clocks. The reference signal REF is used as a reference for comparison with the feedback signal, which models the time delay to compensate and is feedback from the delay modeling circuit 190. The delay line input signal DELAY_IN is applied to the first delay line 160 and undergoes the delay adjusted by the shift register 150 to enable the feedback signal FEEDBACK through the delay modeling circuit 190. The feedback signal FEEDBACK is compared with the rising edge of the reference signal REF at the phase comparator 130. The shift controller 140 outputs the right shift signal SR or the left shift signal SL depending on the comparison result.

FIG. 2 provides a detailed circuit diagram of the conventional phase comparator 130 and the conventional shift controller 140. Referring to FIG. 2, the illustrated conventional phase comparator 130 includes: (a) a first comparator 210 for comparing the reference signal REF with the feedback signal FEEDBACK to produce first and second phase comparison signals PC0 and PC1, (b) a unit delay circuit 220 for delaying the feedback signal FEEDBACK by a unit delay, (c) a second comparator 230 for comparing the reference signal REF with the output signal of the unit delay circuit 220 to produce second and fourth phase comparison signals PC1 and PC3, and (d) a pulse generator 240 for receiving the reference signal REF and the feedback signal FEEDBACK to generate a comparison pulse signal CMP_PULSE.

Referring to FIG. 2, the illustrated conventional shift controller 140 includes: (a) a first NAND gate 250 which receives the first phase comparison signal PC0 and the third phase comparison signal PC2, (b) a first inverter 255 receiving the output of the first NAND gate 250, (c) a second NAND gate 260 receiving the second phase comparison signal PC1 and the fourth phase comparison signal PC3, (d) a second inverter 265 receiving the output of the second NAND gate 260, (e) a third NAND gate 270 receiving the output of the first inverter 255 and the comparison pulse signal CMP_PULSE, (f) a third inverter 275 receiving the output of the third NAND gate 270 to output the right shift signal SR, (g) a fourth NAND gate 280 receiving the output of the second inverter 265 and the comparison pulse signal CMP_PULSE, (h) a fourth inverter 285 receiving the output of the fourth NAND gate 280 to output the left shift signal SL, (i) a NOR gate 290 receiving the right shift signal SR and the left shift signal SL, and (j) a fifth inverter 295 receiving the output of the NOR gate 290 to output the delay locked loop locking signal DLL_LOCKZ.

The phase comparator 130 and the pulse generator 240 generate pulses when the reference signal REF and the feedback signal FEEDBACK are simultaneously high. When this comparison pulse signal CMP_PULSE is activated, the shift controller 140 receives the first to fourth phase comparison signals PC0, PC1, PC2 and PC3 from the phase comparator 130 to output the right shift signal SR and/or the left shift signal SL.

The right shift signal SR and/or the left shift signal SL operate the shift register 150 so as to control the delay amount. Repeating as described above, the delay locked loop clock is generated at locking at which the reference signal REF and the feedback signal FEEDBACK have a minimum jitter.

Receiving the delay locked loop clock generated as described above, data is transferred to outside of a chip through an output buffer, wherein the difference between the output data DQ and the external clock is referred to as an AC parameter tAC (DQ edge to clock edge skew).

The phase comparator 130 compares the reference signal REF and the feedback signal FEEDBACK at every eight clocks even after the delay locked loop clock is generated so as to shift the shift register when there is a difference between the reference signal REF and the feedback signal FEEDBACK.

Accordingly, the phase comparator 130 compares the difference between the reference signal REF and the feedback signal FEEDBACK and generates a corresponding output even if the difference is generated by noise, which could cause undesirable shift operation of the shift register 150.

When data is outputted by using the delay locked loop clock with the delay amount readjusted due to noise and the number of stages of the unit delay of the loop is changed, the AC parameter tAC suffers a loss corresponding to the number of the changed stages of the unit delay.

BRIEF DESCRIPTION OF THE DRAWINGS

Objects and features of the instant invention will become apparent from the following description of preferred embodiments taken in conjunction with the accompanying drawings, in which:

FIG. 4B is a more detailed illustration of the low pass filters of FIG. 4A;

FIGS. 6B and 6C are truth tables of the inputs and outputs associated with the components illustrated in FIG. 6A;

FIG. 6D is a timing diagram associated with the truth table illustrated in FIG. 6C.

DETAILED DESCRIPTION OF THE PREFERRED EMBODIMENTS

Hereinafter, preferred devices constructed in accordance with the teachings of the present invention will be described in detail with reference to the accompanying drawings.

The delay locked loop constructed in accordance with the teachings of the present invention generally includes a phase comparator, a shift register, and a noise determining circuit. The noise determining circuit generally includes an LPF controlling circuit and low pass filters.

Figure 1:
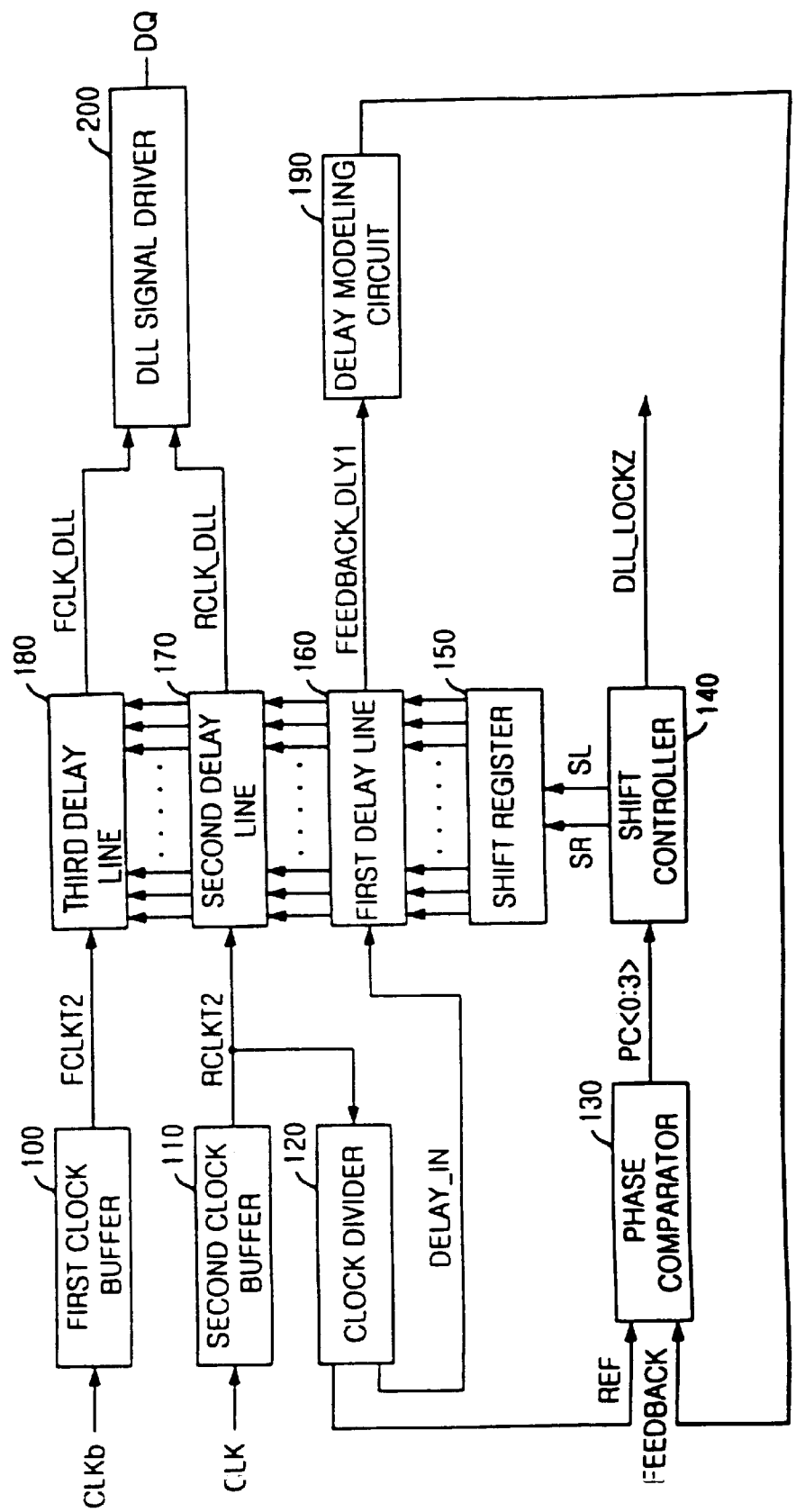
FIG. 1 is a block diagram of a conventional delay locked loop.
Figure 2:
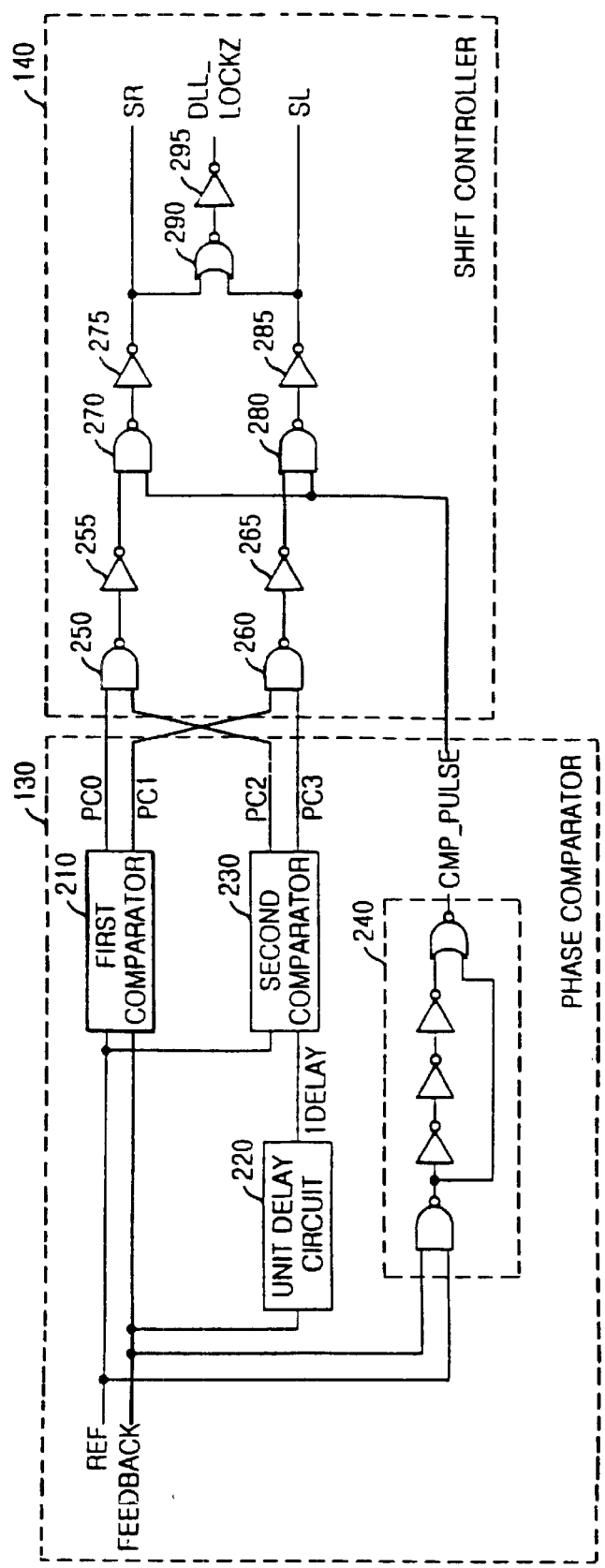
FIG. 2 provides a detailed circuit diagram of a conventional phase comparator and a conventional shift controller.
Figure 3:
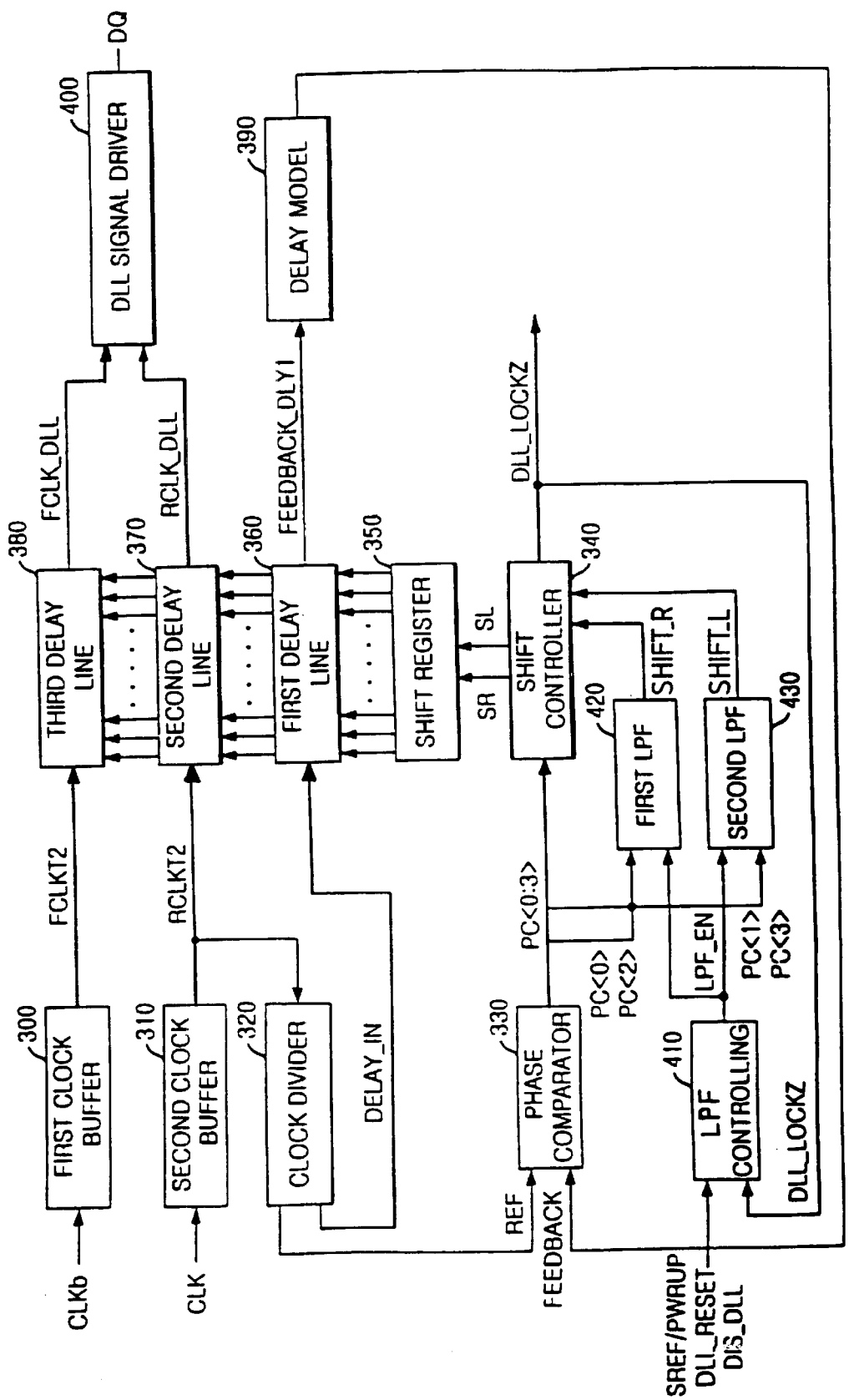
FIG. 3 shows a block diagram of a delay locked loop constructed in accordance with the teachings of the present invention.

Referring to FIG. 3, the illustrated delay locked loop comprises a delay locked loop including a first clock buffer 300 receiving an external clock bar CLKb for producing a falling clock signal FCLKT2 activated at a falling edge of the clock. It also includes a second clock buffer 310 receiving an external clock CLK for producing a rising clock signal RCLKT2 which is activated at a rising edge of the clock. The loop also includes a clock divider 320 for producing a pulse at every other eight clocks of the rising clock signal RCLKT2, and a phase comparator 330 for comparing a reference signal REF from the clock divider 320 with a feedback signal FEEDBACK from a delay modeling circuit 390. The loop further includes a shift controller 340 receiving the output of the phase comparator 330 and the output signals of first and second low pass filters 420 and 430 to produce a right shift signal SR and/or a left shift signal SL to shift a shift register 350. The shift register 350 controls a delay amount by shifting an output signal in response to the right shift signal SR and/or the left shift signal SL from the shift controller 340. The loop also includes a first delay line 360 which is responsive to the output signal of the shift register 350 for adjusting the delay amount of the output signal of the clock divider 320, a second delay line 370 responsive to the output signal of the shift register 350 for adjusting the delay amount of the rising clock signal RCLKT2, and a third delay line 380 responsive to the output signal of the shift register 350 for adjusting the delay amount of the falling clock signal FCLKT2. The delay modeling circuit 390 compensates a time difference between the external clock CLK and an internal clock by using a delay adjusted feedback delay signal FEEDBACK_DLY1 received from the first delay line 360. The loop also includes a delay locked loop signal driving circuit 400 for driving internal circuitry with the outputs of the second and third delay lines 370 and 380, and a low pass filter controlling circuit 410 for receiving a delay locked loop locking signal DLL_LOCKZ, a self-refresh signal SREF, a power-up signal PWRUP, a delay locked loop reset signal DLL_RESET, and a delay locked loop disable signal DIS_DLL from the shift controller 340 to activate the low pass filters. The first low pass filter 420 receives a low pass filter activating signal LPF_EN from the low pass filter controlling circuit 410 and first and third phase comparison signals PC0 and PC2 (which are outputs of the phase comparator 330) to count the number of result values outputted from the phase comparator 330 (see FIG. 4B). The second low pass filter 430 receives the low pass filter activating signal LPF_EN from the low pass filter controlling circuit 410 as well as second and fourth phase comparison signals PC1 and PC3 (which are outputs of the phase comparator 330) to count the number of the result values outputted from the phase comparator 330 (see FIG. 4B).

One of the input signals of the low pass filter controlling circuit 410 is a delay locked loop locking signal DLL_LOCKZ. The delay locked loop locking signal DLL_LOCKZ becomes logic high before a delay locked loop clock is locked and transits to logic low at clock locking.

Therefore, before clock locking, the low pass filter activating signal LPF_EN is logic low and does not operate the first and second low pass filters 420 and 430. And after clock locking, the low pass filter activating signal LPF_EN transits to logic high to operate the first and second low pass filters 420 and 430.

Figure 4A:
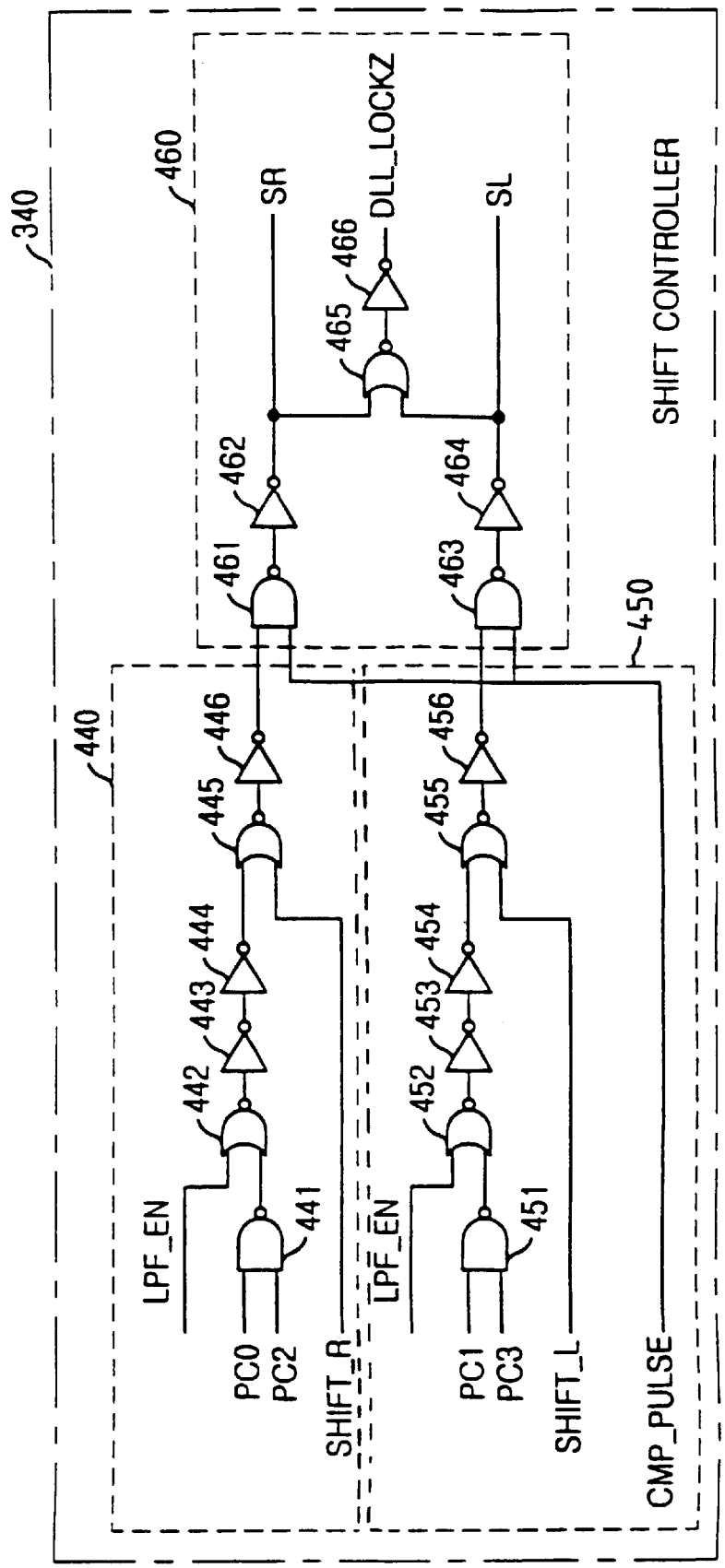
FIG. 4A is a detailed circuit diagram of a shift controller constructed in accordance with the teachings of the present invention.

Referring to FIG. 4A, the shift controller 340 includes a first input circuit 440 receiving the first and third phase comparison signals PC0 and PC2, the low pass filter activating signal LPF_EN, and the output (SHIFT_R) of the first low pass filter 420. A second input circuit 450 receives the second and fourth phase comparison signals PC1 and PC3, the low pass filter activating signal LPF_EN, and the output (SHIFT_L) of the second low pass filter 430. An output circuit 460 receives the outputs of the first and second input circuits 440 and 450 and the comparison pulse signal CMP_PULSE to output the right shift signal SR, the left shift signal SL and the delay locked loop locking signal DLL_LOCKZ.

More particularly, the first input circuit 440 includes a NAND gate 441 receiving the first and third phase comparison signals PC0 and PC2, a first NOR gate 442 receiving the output of the NAND gate 441 and the low pass filter activating signal LPF_EN, a first inverter 443 receiving the output of the NOR gate 442, a second inverter 444 receiving the output of the first inverter 443, a second NOR gate 445 receiving the output of the second inverter 444 and the output of the first low pass filter 420, and a third inverter 446 receiving the output of the second NOR gate 445.

The second input circuit 450 includes a NAND gate 451 receiving the second and fourth phase comparison signals PC1 and PC3, a first NOR gate 452 receiving the output of the NAND gate 451 and the low pass filter activating signal LPF_EN, a first inverter 453 receiving the output of the first NOR gate 452, a second inverter 454 receiving the output of the first inverter 453, a second NOR gate 455 receiving the output of the second inverter 454 and the output of the second low pass filter 430, and a third inverter 456 receiving the output of the second NOR gate 455.

The output circuit 460 includes a first NAND gate 461 receiving the output of the first input circuit 440 and the comparison pulse signal CMP_PULSE, a first inverter 462 receiving the output of the first NAND gate 461 to output the right shift signal SR, a second NAND gate 463 receiving the output of the second input circuit 450 and the comparison pulse signal CMP_PULSE, a second inverter 464 receiving the output of the second NAND gate 463 to output the left shift signal SL, a NOR gate 465 receiving the outputs of the first and second inverters 462 and 464, and a third inverter 466 receiving the output of the NOR gate 465 to output the delay locked loop locking signal DLL_LOCKZ.

In operation, when the low pass filter activating signal LPF_EN is logic low before locking, the shift controller 340 receives the first and third phase comparison signals PC0 and PC2 from the first NOR gate 442 of the first input circuit 440 and the second and fourth phase comparison signals PC1 and PC3 from the first NOR gate 452 of the second input circuit 450 to output the left and right shift signals SL and SR to shift the shift register 350.

On the contrary, when the low pass filter activating signal LPF_EN is logic high, the shift controller 340 blocks the first and third phase comparison signals PC0 and PC2 via the first NOR gate 442 of the first input circuit 440 and the second and fourth phase comparison signals PC1 and PC3 via the first NOR gate 452 of the second input circuit 450 but receives a first shift signal SHIFT_R via the second NOR gate 445 of the first input circuit 440 and a second shift signal SHIFT_L via the second NOR gate 455 of the second input circuit 450.

The first and second shift signals SHIFT_R and SHIFT_L activate the right and left shift signals SR and SL, respectively, to control the shift register 350.

Figure 5:
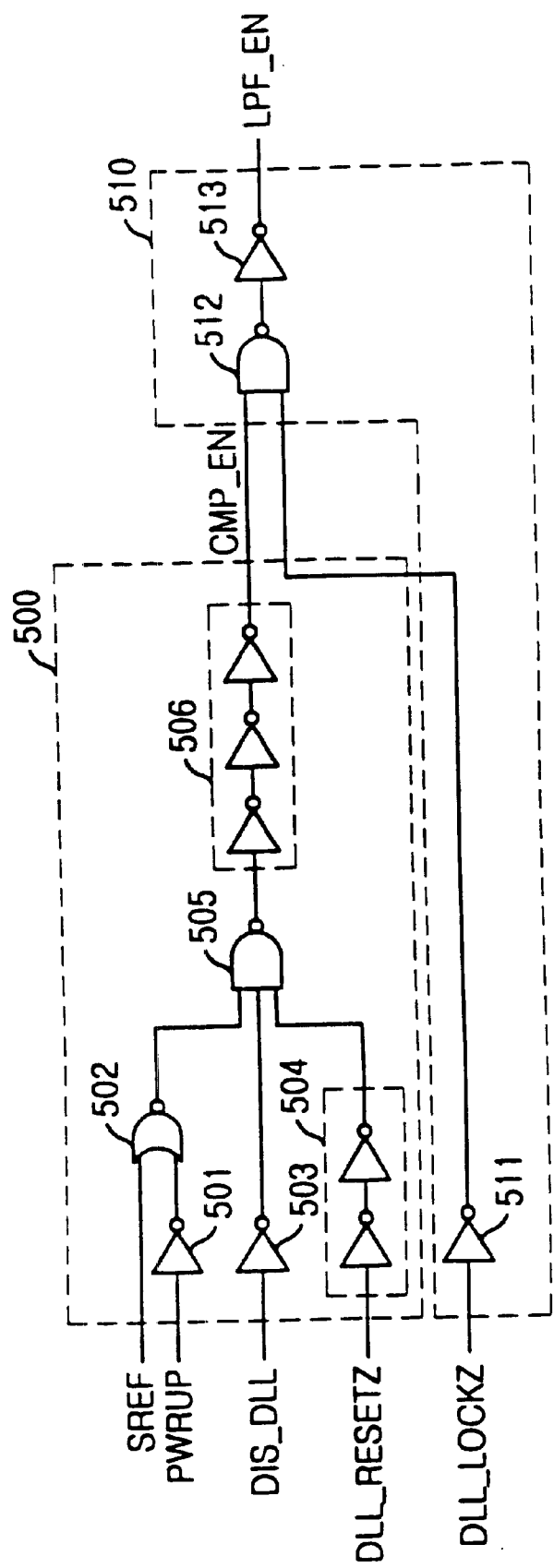
FIG. 5 is a detailed circuit diagram of a low pass filter controller constructed in accordance with the teachings of the present invention.

Referring to FIG. 5, the illustrated low pass filter controlling circuit 410 includes an initializing circuit 500 and an activating circuit 510. The initializing circuit 500 receives as inputs the self-refresh signal SREF, the power-up signal PWRUP, the delay locked loop disable signal DIS_DLL and the delay locked loop reset signal DLL_RESET to notify that the delay locked loop operates. The activating circuit 510 receives as inputs the delay locked loop locking signal DLL_LOCKZ and the output of the initializing circuit 500 to output the low pass filter activating signal LPF_EN.

More particularly, the initializing circuit 500 includes: (a) a first inverter 501 receiving the power-up signal PWRUP, (b) a NOR gate 502 receiving the self-refresh signal SREF and the output of the first inverter 501, (c) a second inverter 503 receiving the delay locked loop disable signal DIS_DLL, (d) a delaying circuit 504 receiving the delay locked loop reset signal DLL_RESET, (e) a NAND gate 505 receiving the output of the NOR gate 502, the output of the second inverter 503 and the output of the delaying circuit 504, and (f) an inverting circuit 506 for inverting the output of the NAND gate 505.

The activating circuit 510 includes a first inverter 511 receiving the delay locked loop locking signal DLL_LOCKZ, a NAND gate 512 receiving the output of the initializing circuit 500 and the output of the first inverter 511, and a second inverter 513 receiving the output of the NAND gate 512 to output the low pass filter activating signal LPF_EN.

In operation, when the operation of the delay locked loop is indicated (i.e., when the self-refresh signal SREF is logic low (i.e., escaped from self-refresh mode), the power-up signal PWRUP is logic high, and the delay locked loop disable signal DIS_DLL is logic low), the inputs of the NAND gate 505 of the initializing circuit 500 all become logic high so that the output of the NAND gate 505 becomes logic low. Accordingly, the output of the NAND gate 505 is inverted to logic high by the inverting circuit 506. When the delay locked loop locking signal DLL_LOCKZ transits to logic low thereby indicating that locking of the delay locked loop has occurred, the inputs of the NAND gate 512 all become logic high so that the low pass filter activating signal LPF_EN is activated to logic high via the inverter 513.

Figure 6A:
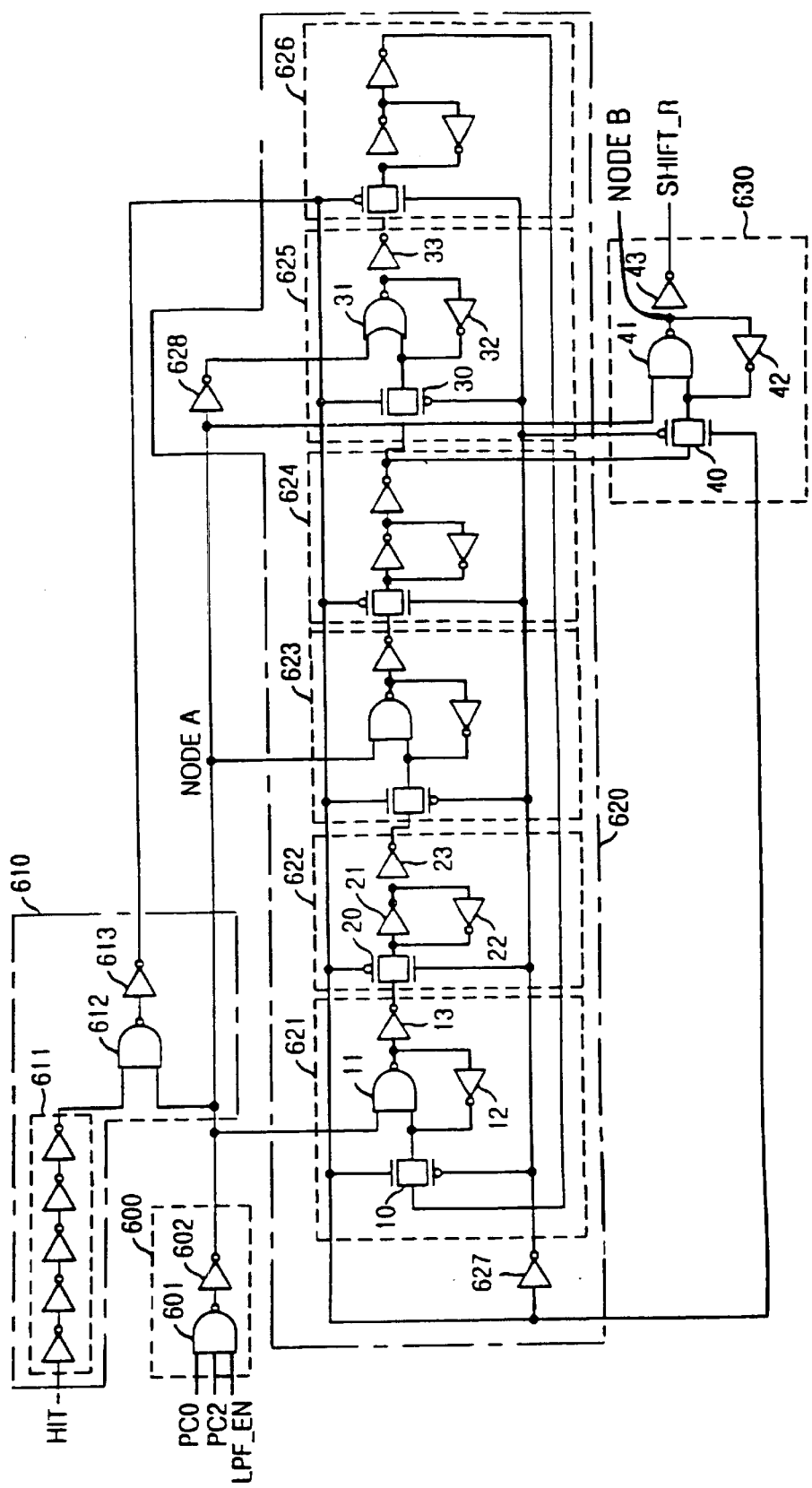
FIG. 6A provides a detailed circuit diagram of a first low pass filter constructed in accordance with the teachings of the present invention.

Referring to FIG. 6A, the illustrated first low pass filter 420 includes an input circuit 600 receiving the first and third phase comparison signals PC0 and PC2 and the low pass filter activating signal LPF_EN. It also includes a controlling circuit 610 receiving a control pulse signal HIT from the phase comparator 330 and the output of the input circuit 600 to control shift of a counter 620. The counter 620 receives the output of the input circuit 600 to count the number of repetitions of logic values of the first and third phase comparison signals PC0 and PC2 under control of the output of the controlling circuit 610. The low pass filter 420 also includes a latch output circuit 630 for latching the output of the counter 620 to output the first shift signal SHIFT_R.

More particularly, the input circuit 600 includes a NAND gate 601 receiving the first and third phase comparison signal PC0 and PC2 and the low pass filter activating signal LPF_EN, and an inverter 602 receiving the output of the NAND gate 601.

The controlling circuit 610 includes: (a) an inverting circuit 611 for inverting the control pulse signal HIT, (b) a NAND gate 612 receiving the inverted control pulse signal HIT and the output of the input circuit 600, and (c) an inverter 613 receiving the output of the NAND gate 612.

The counter 620 includes an inverter 627 inverts the output of the controlling circuit 610. The first stage 621 is controlled by the output of the controlling circuit 610 and receives a feedback output of the sixth stage 626 and the output of the input circuit 600. The second stage 622 is controlled by the output of the controlling circuit 610 and receives the output of the first stage 621. The third stage 623 is controlled by the output of the controlling circuit 610 and receives the output of the second stage 622. The fourth stage 624 is controlled by the output of the controlling circuit 610 and receives the output of the third stage 623. The fifth stage 625 is controlled by the output of the controlling circuit 610 and receives the output of the fourth stage 624. The sixth stage 626 is controlled by the output of the controlling circuit 610 and receives the output of the fifth stage 625.

More particularly, the first stage 621 includes a transfer gate 10 constructed by a NMOS transistor having a gate coupled to the output of the controlling circuit 610 and a PMOS transistor having a gate coupled to the output of the inverter 627 to transfer the feedback output of the sixth stage 626. The first stage 621 also includes a NAND gate 11 receiving the output of the input circuit 600 and the output of the transfer gate 10, a first inverter 12 receiving the output of the NAND gate 11 having an output coupled to the output of the transfer gate 10 to latch, and a second inverter 13 receiving the output of the NAND gate 11.

The second stage 622 includes a transfer gate 20 constructed by a PMOS transistor having a gate coupled to the output of the controlling circuit 610 and a NMOS transistor having a gate coupled to the output of the inverter 627 to transfer the output of the first stage 621. The second stage 622 also includes a first inverter 21 receiving the output of the transfer gate 20, a second inverter 22 receiving the output of the first inverter 21 and having an output coupled to the output of the transfer gate 20 to latch, and a third inverter 23 receiving the output of the first inverter 21.

The fifth stage 625 includes a first inverter 628 receiving the output of the input circuit 600, and a transfer gate 30 constructed by a NMOS transistor having a gate coupled to the output of the controlling circuit 610 and a PMOS transistor having a gate coupled to the output of the inverter 627 to transfer the output of the fourth stage 624. The fifth stage 625 also includes a NAND gate 31 receiving the output of the first inverter 628 and the output of the transfer gate 31, a second inverter 32 receiving the output of the NAND gate 31 and having an output coupled to the output of the transfer gate 30 to latch, and a third inverter 33 receiving the output of the NAND gate 31.

The first stage 621 and the third stage 623 are identical to each other in their structure. The second, fourth and sixth stages 622, 624 and 626 are identical to each other in their structure.

The latch output circuit 630 includes a transfer gate 40 constructed by a PMOS transistor having a gate coupled to the output of the inverter 627 and a NMOS transistor having a gate coupled to the output of the controlling circuit 610 to transfer the output of the fourth stage 624. The latch output circuit 630 also includes a NAND gate 41 receiving the output of the input circuit 600 and the output of the transfer gate 40, a first inverter 42 receiving the output of the NAND gate 41 and having an output coupled to the output of the transfer gate 40 to latch, and a second inverter 43 receiving the output of the NAND gate 41 to output a first shift signal SHIFT_R.

The structure of the second low pass filter 430 is identical to that of the first low pass filter 420 shown in FIG. 6A except that it receives the second and fourth phase comparison signals PC1 and PC3 instead of the first and third phase comparison signals PC0 and PC2 and it outputs the SHIFT_L signal instead of the SHIFT_R signal.

In operation of the first and second low pass filters 420 and 430, when the low pass filter activating signal LPF_EN is logic low, the output of the NAND gate 601 of the input circuit 600 is logic high so that the input circuit 600 does not receive the first and third phase comparison signals PC0 and PC2 at the inputs of the NAND gate 601. In particular, the first and third phase comparison signals PC0 and PC2 do not matter (i.e., "a don't care") to the NAND gate 601 because the low pass filter activating signal LPF_EN is logic low. On the contrary, when the low pass filter activating signal LPF_EN is logic high, the output of the input circuit 600 depends upon the states of the first and third phase comparison signals PC0 and PC2. When the low pass filter activating signal LPF_EN is logic low, the first and second low pass filters 420 and 430 do not operate.

The control pulse signal HIT is a pulse generated at every other predetermined number of clocks. It is a comparison pulse signal CMP_PULSE that determines the timing when the first to fourth phase comparison signals PC0 to PC3 are generated at the phase comparator 330.

If the first and third phase comparison signals PC0 and PC2 from the phase comparator 330 are not both in the logic high level three times sequentially (i.e., during three sequential HIT pulses), the first low pass filter 420 resets the counter 620 and then maintains the first shift signal SHIFT_R at a logic low. When the first and third phase comparison signals PC0 and PC2 from the phase comparator 330 are both at the logic high level three times sequentially, the first low pass filter 420 makes the first shift signal SHIFT_R logic high, and then resets the counter 620 to recount.

FIG. 6B illustrates a truth table for certain elements in FIG. 6A showing a sequence two HIT pulses. In the example of FIG. 6B, one of the first and third phase comparison signals PC0 and PC2 enters a logic low state at the second HIT pulse. If the high state of the first and third phase comparison signals PC0 and PC2 are not repeated three times sequentially, the output node of the input circuit 600 has a logic low value so that the latch circuits of the first, third and fifth stages 10, 30 are initialized again. In particular, the first through sixth stages 621, 622, 623, 624, 625, 626 of the counter 620 return to their initial states in the second sequence of FIG. 6B and the state of the first shift signal SHIFT_R remains low. In effect, the low pass filter has determined that the first request to generate a SHIFT_R signal (shown in FIG. 6B as the first sequence where both PC0 and PC2 are high) was generated by noise. Accordingly, the counter 620 is reset to again start counting.

FIG. 6C illustrates a truth table for certain elements of FIG. 6A for a series of three HIT pulses wherein PC0 and PC2 indicate that the shift right request is not attributed to noise. In the example of FIGS. 6C and 6D, when the first and third phase comparison signals PC0 and PC2 are both logic high, the transfer gates of the second, fourth and sixth stages 622, 624 and 626 of the counter 620 of the first low pass filter 420 are turned on to conduct. If the all high state is repeated three times sequentially, the first shift signal SHIFT_R outputs a logic high. In particular, the first and third phase comparison signals PC0 and PC2 are logic high throughout the first, second, and third sequences. In contrast to FIG. 6B, the first through sixth stages 621, 622, 623, 624, 625, 626 of the counter 620 do not return to their initial states at the second sequence. As a result, the first shift signal SHIFT_R is a logic high because the first low pass filter 420 determined that the output of the phase comparator 330 was not caused by noise.

Figure 7A:
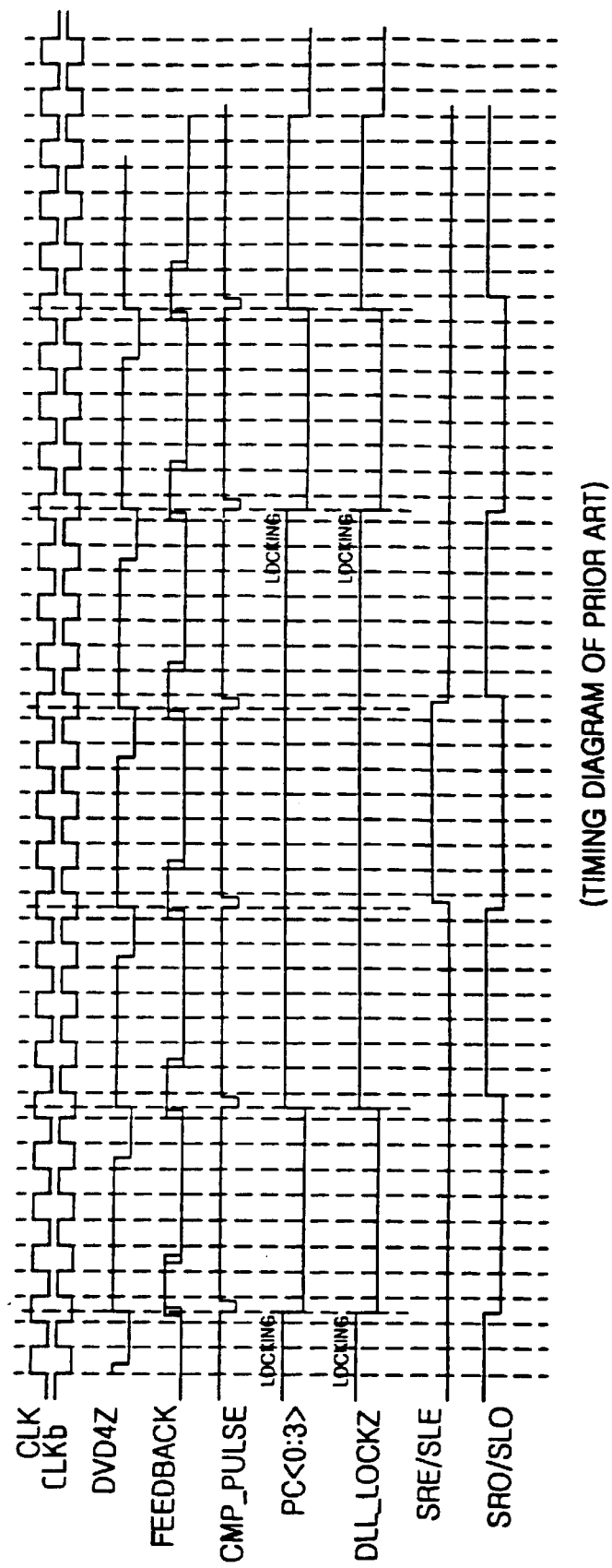
FIGS. 7A and 7B show timing diagrams of the conventional delay locked loop and the delay locked loop constructed in accordance with the teachings of the present invention.
Figure 7B:
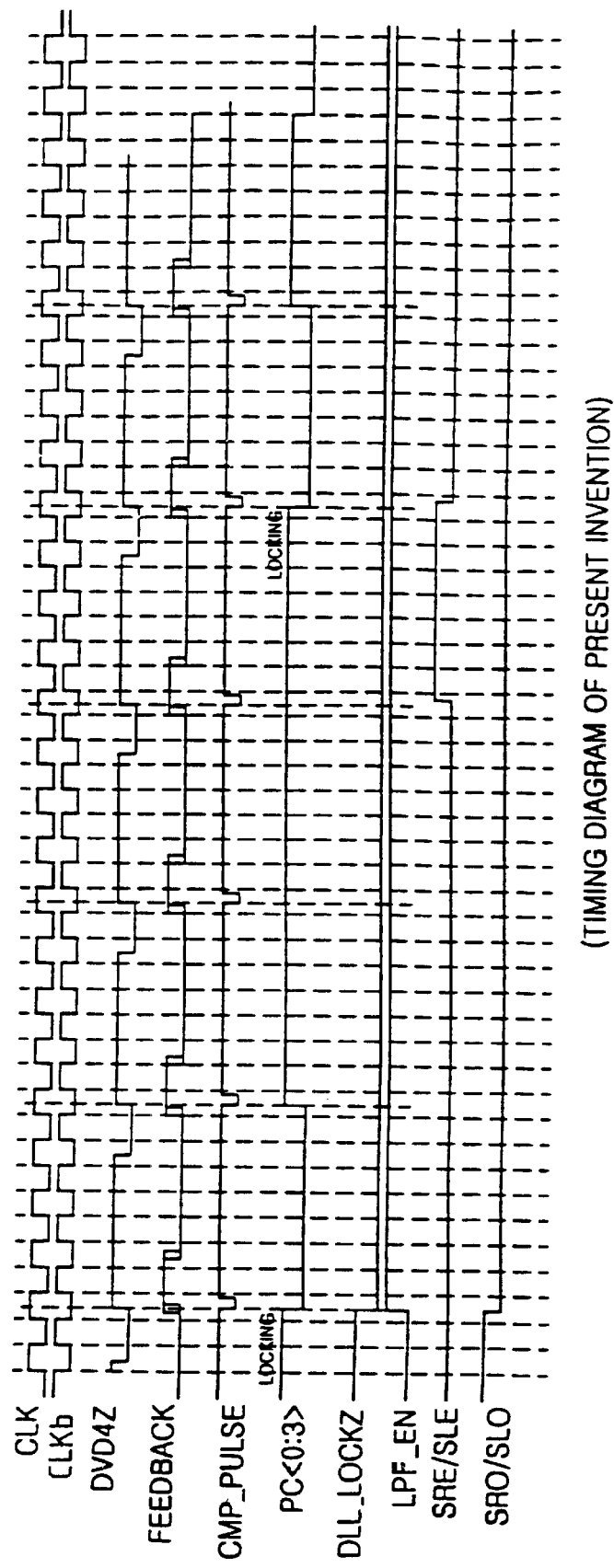

Referring to FIG. 7B, the timing diagram shows that the low pass filter activating signal LPF_EN transits to logic high after the delay locked loop locking signal DLL_LOCKZ falls to logic low when the delay locked loop locking signal is locked.

Before the delay locked loop is locked, the shift controller 340 relays the output of the phase comparator 330 to the shift register 350. On the other hand, after the delay locked loop is locked, the first and second low pass filters 420 and 430 receive the output of the phase comparator 330 so that the first and second shift signals SHIFT_R and SHIFT_L output logic high and the shift controller 340 receives these logic high shift signals only when the phase comparator 330 outputs information for shift of the shift register 350 three times sequentially.

That is, the first and second low pass filters 420 and 430 determine that the output of the phase comparator 330 is originated from noise when the phase comparator 330 outputs the same result less than three times sequentially. When such a noise determination is made, the low pass filters 420, 430 operate to ensure there is no shift of the shift register 350.

As described above, the delay locked loop of improves the AC parameter tAC (DQ edge to CLK edge skew) by constructing the delay locked loop such that it is less sensitive to noise by using the delay locked loop low pass filters.

Although certain methods and apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A delay locked loop comprising:
    a phase comparator for developing a phase comparison signal;
    a shift register responsive to the phase comparison; and
    a noise determining circuit in communication with the phase comparator to determine whether the phase comparison signal output by the phase comparator was produced by noise, wherein the noise determining circuit is enabled when the delay locked loop is locked and wherein when the noise determining circuit is enabled, the noise determining circuit controls the shift register to ignore the phase comparison signal from the signal from the phase comparator if the phase comparison signal was produced by noise.

2. The delay locked loop as recited in claim 1, wherein the noise determining circuit drives the shift register when the phase comparison signal has identical information for driving the shift register at least a predetermined number of times sequentially.

3. The delay locked loop as recited in claim 2, wherein the predetermined number is three.

4. A delay locked loop for use in a semiconductor memory device, the delay locked loop comprising:
    a delay modeling circuit;
    a first clock buffer for receiving an external clock signal and for producing a falling clock signal activated at a falling edge of the external clock signal;
    a second clock buffer for receiving the external clock signal and for producing a rising clock signal activated at a rising edge of the external clock signal;
    clock divider for producing a reference signal at predetermined clocks of the rising clock signal;
    phase comparator for comparing the reference signal from the clock divider with a feedback signal from the delay modeling circuit;
    a first low pass filter for producing a first shift signal;
    a second low pass filter for producing a second shift signal;
    shift controller in communication with the phase comparator and the first and second low pass filters, the shift controller being adapted to selectively produce a right shift signal and a left shift signal;
    a shift register responsive for controlling delay amount to the right shift signal and the left signal from the shift controller;
    a first delay line responsive to an output signal of the shift register for adjusting a delay amount of an output signal of the clock divider;
    a second delay line responsive to the output signal of the shift register for adjusting a delay amount of the rising clock signal;
    a third delay line responsive to the output signal of the shift register for adjusting a delay amount of the falling clock signal;
    a delay locked loop signal driving circuit for driving internal circuitry with outputs of the second and third delay lines;
    a low pass filter controlling circuit for receiving a delay locked loop locking signal, from the shift controller to generate a low pass filter activating signal,
    wherein the first low pass filter is responsive to the low pass filter activating signal from the low pass filter controlling circuit and to a first comparator signal output by the phase comparator to output the first shift signal if the first phase comparison signal is identical for a predetermined number of times sequentially, and
    wherein the second low pass filter is responsive to the low pass filter activating signal from the low pass filter controlling circuit and to a second comparator signal output by the phase comparator to output the second shift signal if the second phase comparison signal is identical for a predetermined number of times sequentially and wherein the delay modeling circuit compensates time difference between the external clock signal and an internal clock signal by using a delay adjusted feedback delay signal received from the first delay line.

5. The delay locked loop as recited in claim 4, wherein the shift controller includes:
    a first input circuit for receiving the first comparator signal, the low pass filter activating signal and an output of the second low pass filter;
    a second input circuit for receiving the second comparator signal, the low pass filter activating signal and an ouput of the second low pass filer; and
    an output circuit for receiving the outputs of the first and second input circuits and comparison pulse signal to output the right shift signal, the left shift signal and the delay locked loop locking signal,
    wherein the first comparator signal comprises first and third phase comparison signals and the second comparator signal comprises second and fourth phase comparison signals.

6. The delay locked loop as recited in claim 5, wherein the first input circuit includes:
    a NAND gate for receiving the first and third phase comparison signals;
    a first NOR gate for receiving an output of the NAND gate and the low pass filter activating signal;
    a first inverter for receiving an output of the NOR gate;
    a second inverter for receiving an output of the first inverter;
    a second NOR gate for receiving an output of the second inverter and the output of the first low pass filter; and
    a third inverter for receiving the output of the second NOR gate.

7. The delay locked loop as recited in claim 5, wherein the second input circuit includes:
    a NAND gate for receiving the second and fourth phase comparison signals;
    a first NOR gate for receiving an output of the NAND gate and the low pass filter activating signal;
    a first inverter for receiving an output of the first NOR gate;
    a second inverter for receiving an output of the first inverter;

a second NOR gate for receiving an output of the second inverter and the output of the second low pass filter; and a third inverter for receiving the output of the second NOR gate.

8. The delay locked loop as recited in claim 5, wherein the output circuit includes:

a first NAND gate for receiving an output of the first input circuit and the comparison pulse signal;

a first inverter for receiving an output of the first NAND gate and for generating the right shift signal;

a second NAND gate for receiving an output of the second input circuit and the comparison pulse signal;

a second inverter for receiving an output of the second NAND gate and for generating the left shift signal;

a NOR gate for receiving outputs of the first and second inverters; and a third inverter for receiving an output of the NOR gate to output the delay locked loop locking signal.

9. The delay locked loop as recited in claim 4, wherein the low pass filter controlling circuit includes:

an initializing circuit for receiving a self-refresh signal, a power-up signal, a delay locked loop disable signal and a delay locked loop reset signal to indicate that the delay locked loop is operating; and an activating circuit for receiving the delay locked loop locking signal and an output of the initializing circuit and for generating the low pass filter activating signal.

10. The delay locked loop as recited in claim 9, wherein the initializing circuit includes:

a first inverter for receiving the power-up signal;

a NOR gate for receiving the self-refresh signal and an output of the first inverter;

a second inverter for receiving the delay locked loop disable signal;

a delaying circuit for receiving the delay locked loop reset signal;

a NAND gate for receiving an output of the NOR gate, an output of the second inverter and an output of the delaying circuit; and an inverting circuit for inverting an output of the NAND gate.

11. The delay locked loop as recited in claim 9, wherein the activating circuit includes:

a first inverter for receiving the delay locked loop locking signal;

a NAND gate for receiving the output of the initializing circuit and an output of the first inverter; and a second inverter for receiving an output of the NAND gate to output the low pass filter activating signal.

12. The delay locked loop as recited in claim 4, wherein the first low pass filter includes:

an input circuit for receiving the first comparator signal and the low pass filter activating signal;

a controlling circuit for receiving a control pulse signal from the phase comparator and an output of the input circuit;

a counter for receiving the output of the input circuit to count the number of repetitions of logic values of the first comparator signals under control of an output of the controlling circuit; and a latch output circuit for latching an output of the counter to output the first shift signal.

13. The delay locked loop as recited in claim 12, wherein the input circuit includes:

a NAND gate for receiving the first comparator signal and the low pass filter activating signal; and an inverter for receiving an output of the NAND gate.

14. The delay locked loop as recited in claim 12, wherein the controlling circuit includes:

an inverting circuit for inverting the control pulse signal;

a NAND gate for receiving the control pulse signal and the output of the input circuit; and an inverter for receiving an output of the NAND gate.

15. The delay locked loop as recited in claim 12, wherein the counter includes:

an inverter for inverting the output of the controlling circuit;

a first stage controlled by the output of the controlling circuit, the first stage receives a feedback output of a sixth stage and the output of the input circuit;

a second stage controlled by the output of the controlling circuit, the second stage receives an output of the first stage;

a third stage controlled by the output of the controlling circuit, the third stage receives an output of the second stage;

a fourth stage controlled by the output of the controlling circuit, the fourth stage receives an output of the third stage;

a fifth stage controlled by the output of the controlling circuit, the fifth stage receives an output of the fourth stage; and the sixth stage controlled by the output of the controlling circuit, the sixth stage receives an output of the fifth stage.

16. The delay locked loop as recited in claim 15, wherein the latch output circuit includes:

a transfer gate constructed by a PMOS transistor having a gate coupled to an output of the inverter and a NMOS transistor having a gate coupled to the output of the controlling circuit to transfer the output of the fourth stage;

a NAND gate for receiving the output of the input circuit and an output of the transfer gate;

a first inverter for receiving an output of the NAND gate and having an output coupled to an output of the transfer gate to latch; and a second inverter for receiving the output of the NAND gate to output a first shift signal.

17. The delay locked loop as recited in claim 15, wherein the first stage includes:

a transfer gate constructed by a NMOS transistor having a gate coupled to the output of the controlling circuit and a PMOS transistor having a gate coupled to an output of the inverter to transfer the feedback output of the sixth stage;

a NAND gate for receiving the output of the input circuit and an output of the transfer gate;

a first inverter for receiving an output of the NAND gate and having an output coupled to an output of the transfer gate to latch; and a second inverter for receiving the output of the NAND gate.

18. The delay locked loop as recited in claim 15, wherein the second stage includes:

a transfer gate constructed by a PMOS transistor having a gate coupled to the output of the controlling circuit and a NMOS transistor having a gate coupled to an output of the inverter to transfer the output of the first stage;

a first inverter for receiving an output of the transfer gate;

a second inverter for receiving an output of the first inverter and having an output coupled to the output of the transfer gate to latch; and a third inverter for receiving the output of the first inverter.

19. The delay locked loop as recited in claim 15, wherein the fifth stage includes:

a first inverter for receiving the output of the input circuit;

a transfer gate constructed by a NMOS transistor having a gate coupled to the output of the controlling circuit and a PMOS transistor having a gate coupled to an output of the inverter to transfer the output of the fourth stage;

a NOR gate for receiving an output of the first inverter and an output of the transfer gate;

a second inverter for receiving an output of the NOR gate and having an output coupled to the output of the transfer gate to latch; and a third inverter for receiving the output of the NOR gate.

20. A delay locked loop comprising:

a plurality of delays lines for delaying external clock signals;

a shift register to control an amount of delay in the plurality of delay lines;

a shift controller to control the shift register in response to a phase comparison signal;

a phase comparator to produce the phase comparison signal by comparing a reference signal with a delay clock signal; and a noise determining circuit in communication with the phase comparator and enabled when the delay locked loop is locked to receive the comparison signal from the phase comparator, wherein when the noise determining circuit is enabled, the noise determining circuit controls the shift controller to ignore the phase comparison signal from the phase comparator until the phase comparison signal having identical information to drive the shift controller is issued at least a predetermined number of times sequentially.

* * * * *

UNITED STATES PATENT AND TRADEMARK OFFICE
CERTIFICATE OF CORRECTION

PATENT NO.   : 6,433,597 B2
DATED        : August 13, 2002
INVENTOR(S)  : Hea-Suk Jung It is certified that error appears in the above-identified patent and that said Letters Patent is hereby corrected as shown below:

Column 9,
Line 54, replace "shift controller" with -- a shift controller --.

Column 14,
Line 2, replace "of delays lines" with -- of delay lines --.

Signed and Sealed this

Eighteenth Day of February, 2003

JAMES E. ROGAN
*Director of the United States Patent and Trademark Office*